US006954392B2

(12) United States Patent
Baker

(10) Patent No.: US 6,954,392 B2
(45) Date of Patent: Oct. 11, 2005

(54) METHOD FOR REDUCING POWER CONSUMPTION WHEN SENSING A RESISTIVE MEMORY

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/400,620

(22) Filed: Mar. 28, 2003

(65) Prior Publication Data

US 2004/0190334 A1 Sep. 30, 2004

(51) Int. Cl.[7] ................................................ G11C 7/02
(52) U.S. Cl. ..................... 365/209; 365/158; 365/171
(58) Field of Search ............................... 365/209, 158, 365/171, 173

(56) References Cited

U.S. PATENT DOCUMENTS

| 5,614,856 | A | 3/1997 | Wilson et al. | |
|---|---|---|---|---|
| 6,191,989 | B1 * | 2/2001 | Luk et al. | ................... 365/209 |
| 6,317,375 | B1 | 11/2001 | Perner | |
| 6,385,079 | B1 | 5/2002 | Tran | |
| 6,385,111 | B2 | 5/2002 | Tran et al. | |
| 6,434,049 | B1 | 8/2002 | Trivedi et al. | |
| 6,456,525 | B1 | 9/2002 | Perner et al. | |
| 6,462,983 | B2 * | 10/2002 | Katti et al. | ................. 365/171 |
| 2001/0053104 | A1 | 12/2001 | Tran et al. | |
| 2002/0021580 | A1 | 2/2002 | Katti et al. | |
| 2002/0039309 | A1 | 4/2002 | Lu et al. | |
| 2002/0080648 | A1 | 6/2002 | Kim | |
| 2002/0085413 | A1 | 7/2002 | Trivedi et al. | |
| 2002/0101758 | A1 | 8/2002 | Baker | |
| 2004/0090852 | A1 * | 5/2004 | Smith et al. | ................ 365/207 |

FOREIGN PATENT DOCUMENTS

| EP | 1 132 924 A2 | 12/2001 |
|---|---|---|
| EP | 1 132 924 A3 | 4/2002 |

* cited by examiner

Primary Examiner—Huan Hoang
(74) Attorney, Agent, or Firm—Dickstein Shapiro Morin & Oshinsky LLP

(57) ABSTRACT

An apparatus and method is disclosed for reducing power consumption when sensing a resistive memory. A switch, with one end coupled to a terminal of a capacitive element at a node, is coupled from the other end to a bit line from a resistive memory array. A sensing device is further connected to the node, wherein the switch closes and opens to sample and store voltage signals transmitted on the bit line in the capacitive element. The sampled signal is then transmitted to a sensing apparatus that performs sensing operations on the signal.

48 Claims, 7 Drawing Sheets

US 6,954,392 B2

METHOD FOR REDUCING POWER CONSUMPTION WHEN SENSING A RESISTIVE MEMORY

FIELD OF THE INVENTION

The present invention relates to memory devices, and more particularly to a sensing circuit for sensing the logical state of a resistive memory cell.

BACKGROUND OF THE INVENTION

A resistor-based memory array 200, such as that depicted in FIG. 1, typically contains intersecting row lines 210 and column lines 220 which are interconnected by resistive memory cells 230 at the cross point of the row and column lines. A magnetic random access memory (MRAM) is one example of a memory device which includes resistive memory cells arranged as shown in FIG. 1.

FIG. 1 shows a portion of a resistive memory device. The device includes an array 200 of Magnetic Random Access Memory (MRAM) elements, a plurality of electrically conductive row lines 210, and a plurality of electrically conductive column lines 220. Each row line is connected to each of the plurality of column lines by a respective MRAM resistive element 230. If resistive memory array consists of 1024 rows and 1024 columns, i.e., approximately 1 million cells, and each cell has a resistance of 1.2 MΩ or 800 KΩ, depending on its logic state, the collective resistance when all rows and all columns, except for those associated with the selected cell, are respectively shorted together will be approximately 1 KΩ. Typically during the read process, a voltage is impressed across a selected row or cell, resulting in a voltage at node "A," as a result of current flow through memory cell 130 connected to node "A."

A plurality of switches 240, are respectively switchingly connected between one of the row lines and a first source of constant potential (ground) 250. The switches may be implemented as transistors, or may be a form of other programmable switches that are known in the art. A plurality of sensing circuits 260, are respectively connected to the plurality of column lines 220. Each sensing circuit 260 includes a source of constant electrical potential ($V_A$) which is applied to the respective column line. A plurality of pull-up voltage sources 215, supplying voltage $V_A$, are respectively connected to each of the plurality of row lines 210.

In operation, switch 240, such as switch 270 associated with a particular row line 280, is closed so as to bring that row line to the ground potential and a particular column line, e.g., 320 is sensed to read the resistance value of a particular resistor 310.

FIG. 2, shows the resulting electrical circuit for the relevant portion 300 of the memory array when row 280 is grounded. As shown, memory element 310 to be sensed is connected between a grounded row line 280 and a particular column line 320. Also connected to the column line 320 are a plurality of other resistive memory elements (e.g. elements 330, 340, 350, 360, 370) each of which is connected at its opposite end to a pull-up voltage source $V_A$ 215 through a respective row line 210. In addition, a sensing circuit 400 is connected to the column line 320. The sensing circuit 400 includes a voltage supply (not shown) that maintains the column line 320 at the potential of the voltage source $V_A$.

The other resistive memory elements (those tied to ungrounded row lines) 330, 340, 350, 360, 370, form an equivalent resistance referred to as sneak resistance. The effective resistance of the sneak resistance is small. A typical value for the sneak resistance might be 1 KΩ. Nevertheless, because both ends of each ungrounded element 320, 340, 350, 360, 370 are ideally maintained at the same potential as the column line 320 (e.g., $V_A$), net current flow through the sneak resistance is desirably nearly zero.

In contrast, a measurable current flows through the grounded resistive memory element 310. This measurable current allows the sensing circuit 400 to evaluate the resistance of the memory element 310 by the sensing circuit 400. Since significant current can flow in a resistive memory array when sensing the value of the memory element, a continuous power draw on the memory array will require a relatively large current draw from a power source.

BRIEF SUMMARY OF THE INVENTION

The present invention provides a method and apparatus for reducing the size of a power source required for a resistive memory array and provides a simplified and reliable method for sensing the resistance of a resistive memory cell of the array. A voltage sensing circuit is utilized, wherein a resistance to be sensed is configured in a voltage divider, formed by the resistance of the sensed cell and the sneak path resistance of non-selected cells. A known voltage is applied across the voltage divider and a resulting voltage drop across the sensed resistance is detected at a bit line of the array. According to the invention, the applied voltage is active for only a portion of a read cycle and the resulting bit line voltage is stored for processing during a further portion of the read cycle. By limiting the time interval during which the applied voltage is active, power dissipation within the memory device is significantly reduced.

The forgoing and other features of the invention will become more apparent from the detailed description of preferred embodiments of the invention given below with reference to the accompanying drawings.

DETAILED DESCRIPTION OF THE INVENTION

The present invention will be described as set forth in exemplary embodiments illustrated in FIGS. 3–8. Other embodiments may be realized and other changes may be made to the disclosed embodiments without departing from the spirit and scope of the present invention.

Figure 1:
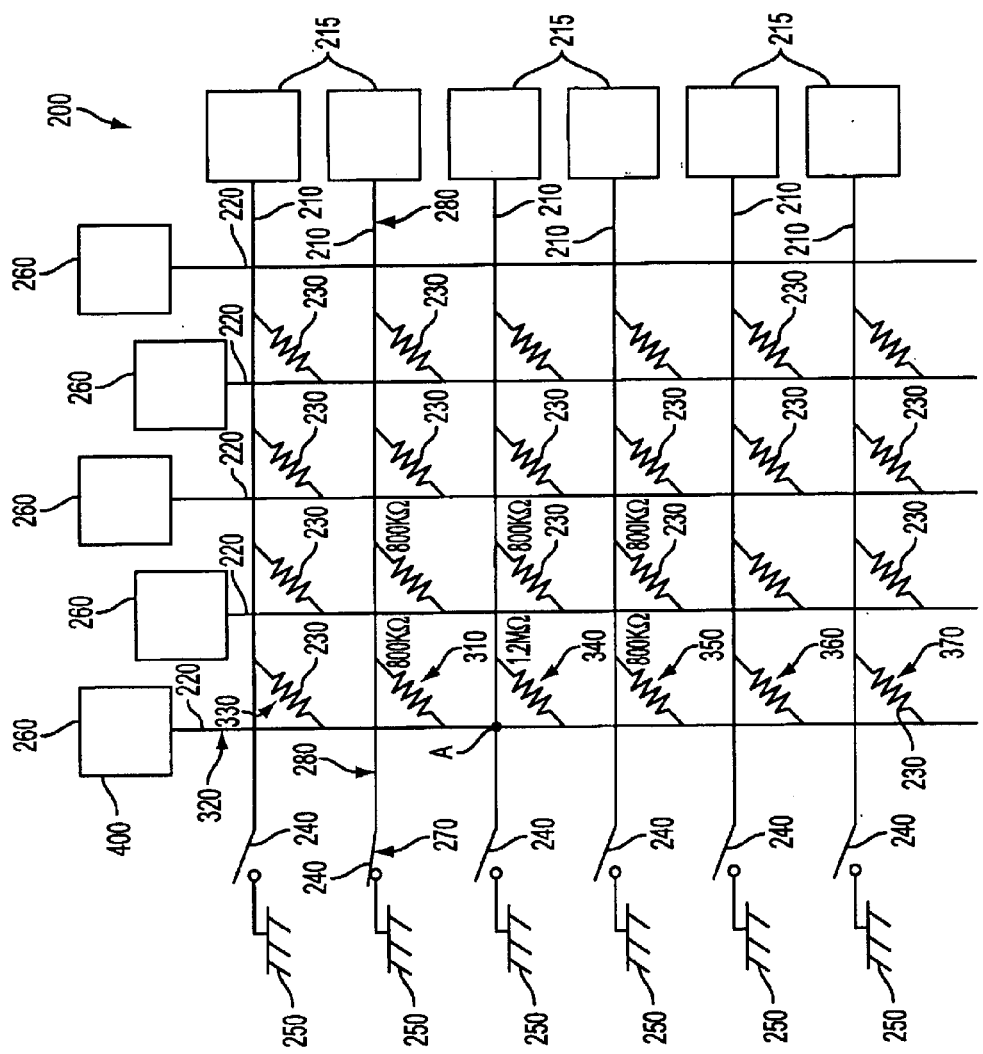
FIG. 1 illustrates a typical resistor-based memory cell array, including resistance sensing circuits.
Figure 2:
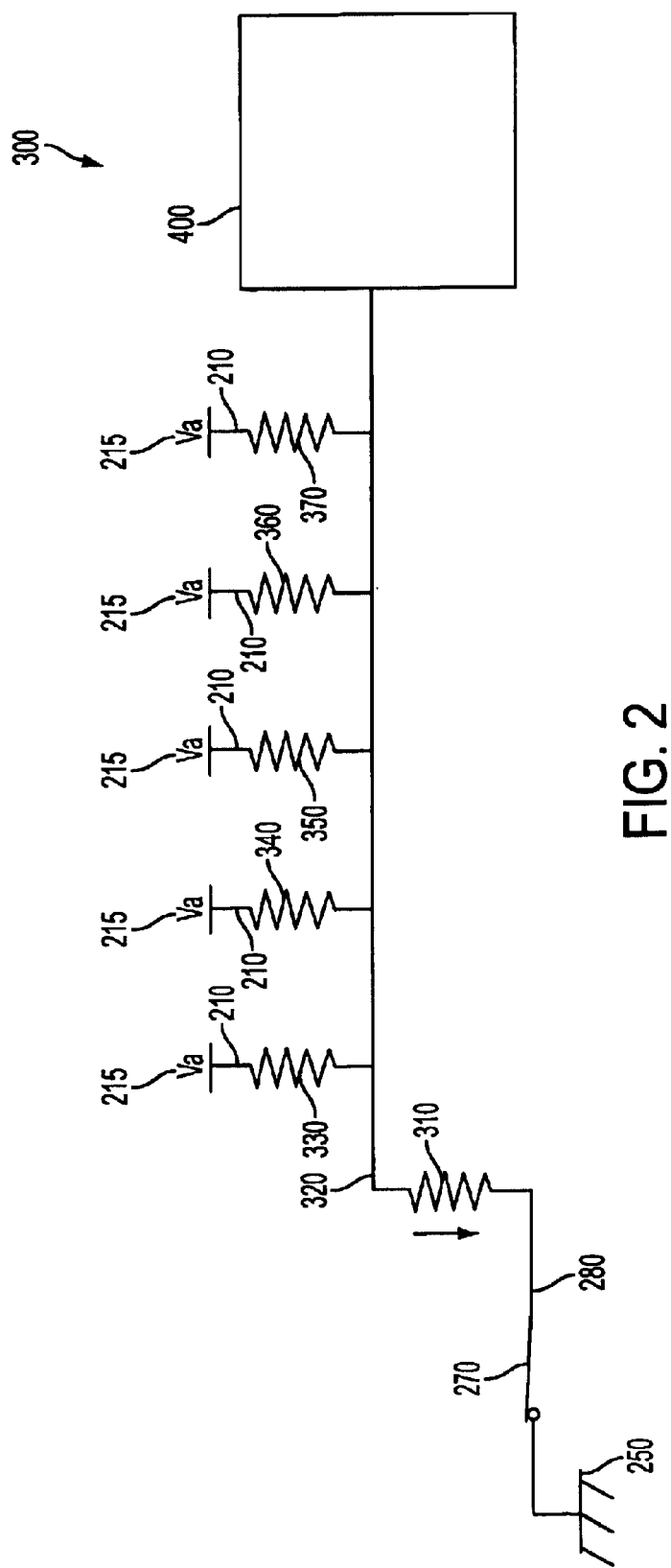
FIG. 2 illustrates a portion of a typical resistor-based memory cell array including a sensing circuit and sneak resistance.
Figure 3:
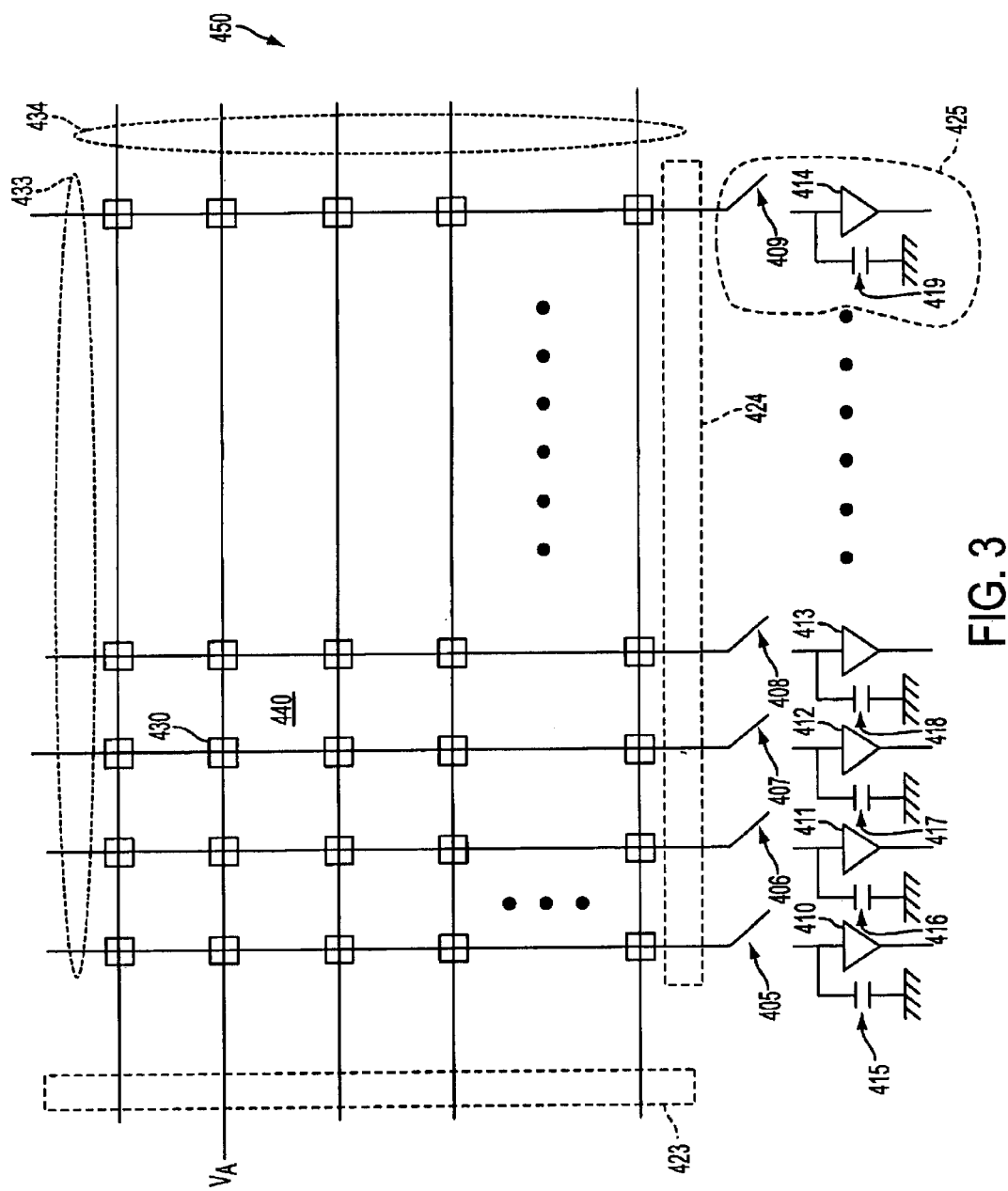
FIG. 3 illustrates a resistive memory array with voltage sensing constructed in accordance with a first exemplary embodiment of the invention.

FIG. 3 illustrates a voltage sensing circuit for a resistive memory array according to a first exemplary embodiment of the invention. A memory array 450 is illustrated, wherein the array 450 has column lines (or "bit" lines) 433 and row lines 434. A row decoder 423 is shown and operates to select one of the row lines 434 during a read operation, while column decoder 424 operates to select one of the column lines 433 for readout. Word lines and column lines are selected through the application of a sense voltage ($V_A$) to a selected line. Typically, all row/column lines will be set to ground, and a selected row will have voltage $V_A$ applied to it.

Figure 4:
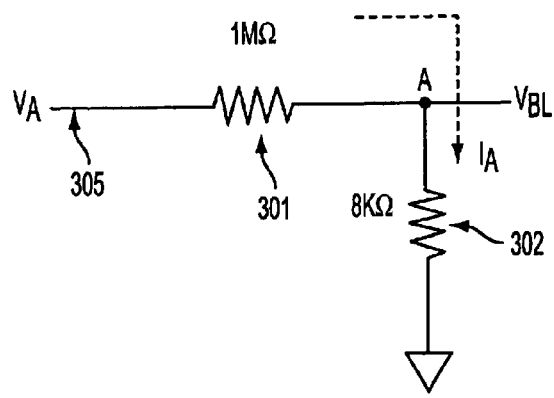
FIG. 4 illustrates a current path along a bitline.

Each memory cell 430 has two possible resistance states, one of which corresponds to a logic value '0' and the other of which corresponds to a logic value '1.' For MRAM cells, the resistance state of a selected memory cell 430 may be set by applying magnetic fields to the selected memory cell. The manner of doing this is well-known in the art and will not be repeated herein. FIG. 4 illustrates an equivalent resistance 302 which represents the resistive value of the non-selected resistive elements coupled to the same column line, which forms a sneak path to ground. The value of resistance 302 is much less than the resistance of sensed cell 301 as the remaining cells connect to the selected column (bit) line are in parallel.

When the applied sense voltage $V_A$ is impressed upon row line 305, a resulting sense current $I_A$ travels along selected row line 305 through resistive memory element 301 and into a first end of resistance 302, which is coupled at a second end to ground. A resulting bit line voltage $V_{BL}$ is then impressed on node "A," which is common to both resistor 301 and resistor 302. Voltage $V_{BL}$ is subsequently sensed. Assuming in the example that the equivalent resistance of memory cell 301 is 1 MΩ, and the equivalent resistance of resistance 302 is 8 kΩ, a sense voltage ($V_A$) of approximately 500 mV would result in a sense current ($I_A$) of approximately 0.5 μA in the bit line. Thus, an array containing, for example, 2,000 columns could have a total current draw of 1 mA (2,000×0.5 μA). For 1,000 arrays active at the same time, the total chip current could reach 1 Amp (1,000×1 mA), which is a considerable current draw for an integrated circuit device.

Referring back to FIG. 3, the illustrated embodiment of the invention further contains a plurality of sample-and-hold circuits 425. Each sample-and-hold circuit 425 contains a respective switch 405 . . . 409 provided in series with a respective column (bit) lines 433. The switches are typically implemented as transistors. In addition, a plurality of compacitors 415–419 are respectively coupled between each bit line 433 and a ground potential. The capacitors 415–419 may be discrete components, or may also be a parasitic capacitance of a respective sense amplifier 410 . . . 414 which is part of a sample and hold circuit 425, or a parasitic capacitance of a respective bit line 433.

Prior to starting a read operation, the capacitors 415 . . . 419 are equilibrated by applying a known voltage across each capacitor 415 . . . 419. This can be done by temporarily closing each of the switches 405 . . . 409 and applying a pre-charge voltage to each bit line 433. After the capacitors 415 . . . 419 are pre-charged, all switches 405 . . . 409 are opened. Subsequently, during a read operation, a selected row line is set to the voltage $V_a$ and the voltage of a selected column line is sampled by closing a respective one of switches 405 . . . 409 and storing the sampled voltage on a respective capacitor 415 . . . 419. The output of each capacitor 415 . . . 419 is also coupled to a respective sense amplifier 410–414. Thus the voltage stored on a capacitor is available as an input to its respective sense amplifier during the sense operation.

Figure 5:
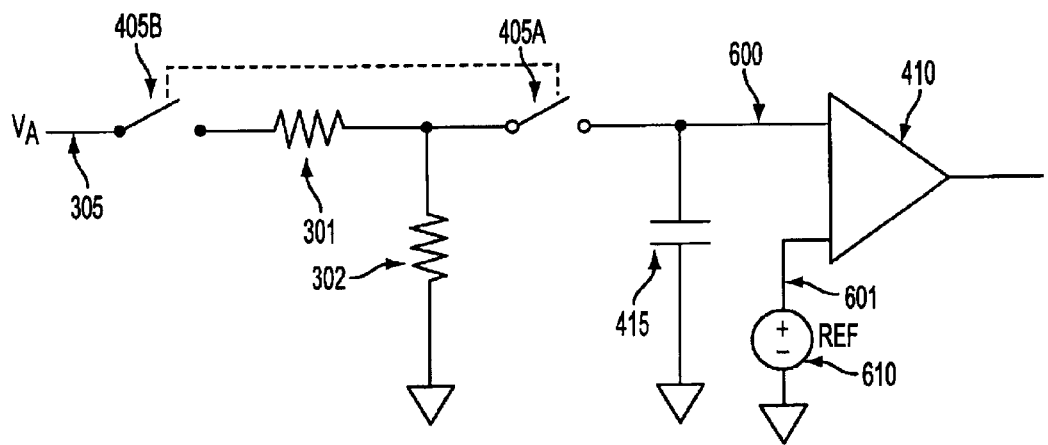
FIG. 5 illustrates an exemplary voltage sensing circuit in accordance with the first embodiment of the invention.
Figure 6:
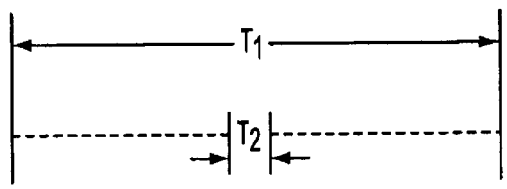
FIG. 6 illustrates a sampled time period wherein voltage is applied at a resistive memory array node.

Turning to FIG. 5, an equivalent circuit is disclosed, showing the sample and hold circuit 425 coupled to a portion of the column line of a selected memory cell. Initially, switch 405 is open during the beginning of a read/sensing period when a voltage $V_a$ is supplied to a selected row, depicted as $T_1$ in FIG. 6. At a predetermined time period after $T_1$, switch 405 closes for a short period $T_2$ and then opens, at which point capacitor 415 is charged by the bit line sense voltage. As can be seen from FIG. 6, the sampling time period $T_2$ is a fraction of the read/sensing period $T_1$. Once charged with the bit line voltage, the capacitor then discharges the sampled sense voltage to input 600 of the sense amplifier 410. A reference voltage 610 is input into the second terminal 601 of sense amplifier 410. Assuming that a conventional sensing time period $T_1$ lasts 10 μs, sampling the voltage sense for a period of 100 ns would reduce the power from array current by approximately 99%. It is understood that the circuit and method discussed above is equally applicable to a reverse situation, where a voltage is applied to a column line, and the row line is read/sensed.

Figure 7:
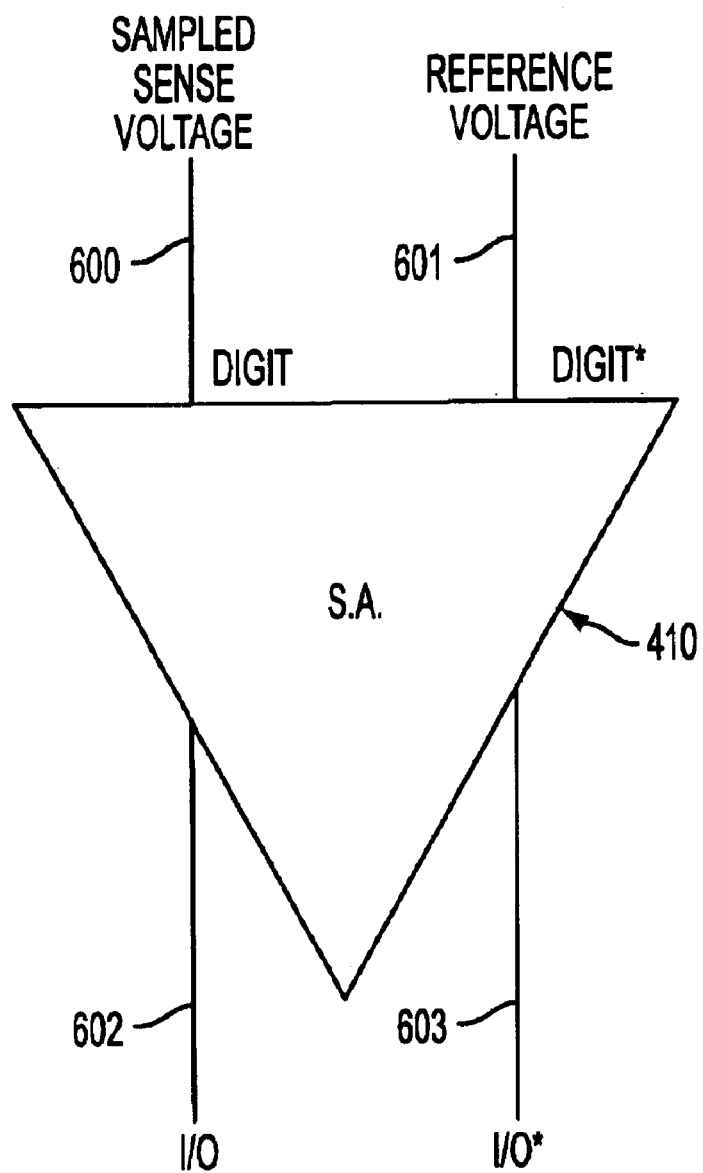
FIG. 7 illustrates the inputs and outputs of a sense amplifier.

An exemplary embodiment of sense amplifier 410 is illustrated in FIG. 7. Sense amplifier 410 has a first input line 600 for receiving the sampled sense voltage measured across a resistor 301 (FIG. 4) of a selected resistor based memory cell 440 (FIG. 3). The first input line 600 may also be referred to as a "Digit" line. Sense amplifier 410 also has a second input line 601 for receiving a reference voltage. The second input line 601 may be referred to as "Digit*." Sense amplifier 410 also has two output lines I/O 602 and I/O* 603. The output lines I/O 602 and I/O* 603 provide complementary outputs depending on whether the voltage on the Digit input line 600 is higher or lower than the voltage on the Digit* input line 601.

The sample-and-hold circuit 425 discussed above can be configured for use with an averaging sense amplifier. An example of such circuitry is provided in the commonly-assigned, co-pending U.S. patent application Ser. No. 10/147,668, filed May 16, 2002, and entitled NOISE RESISTANT SMALL SIGNAL SENSING CIRCUIT FOR A MEMORY DEVICE, which is incorporated herein by reference.

Figure 8:
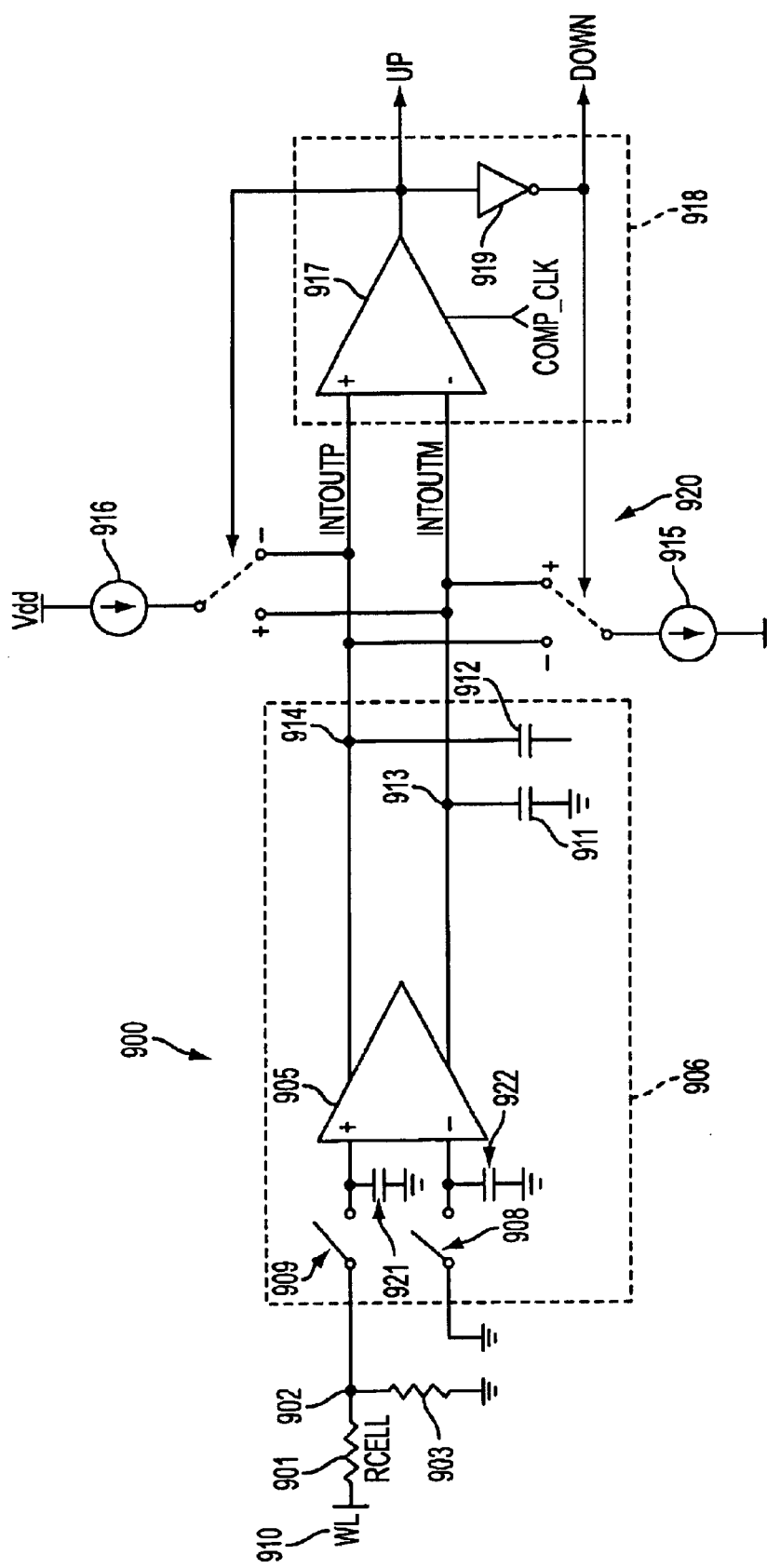
FIG. 8 illustrates a second exemplary embodiment of the invention, wherein the operational amplifier uses sampled voltages for averaging a sense operation.

FIG. 8 illustrates an embodiment of an "averaging" sense circuit which can be used in accordance with the present invention. The illustrated sensing circuit 900 includes an integrator stage 906, a switching current source 920, and a clocked comparator 918. As will be explained in more detail below, an output signal UP (or DOWN) of the sensing circuit 900 is provided to an UP/DOWN counting circuit shown in FIG. 8 and is averaged over a period of time to determine the data state stored in a resistive memory cell 901. The average value calculated is indicative of the data state of the memory cell. Thus, the sensing circuit 900 outputs a stream of UP/DOWN pulses resulting from the cyclical charging and discharging of capacitors 912, 911. The ratio of logic "1"bits (or alternatively, logic "0" bits) to a total number of bits yields a numerical value that corresponds to an average current through a memory cell, such as resistive memory cell 901, in response to an applied voltage. The average current, in turn, is used to determine the logic state of the data stored by the resistive memory cell 901. Circuitry for performing the averaging operation of the pulse stream provided by the sensing circuit 900 has not been shown or described in great detail in order to avoid obscuring the description of the present invention. A more detailed explanation of some of the techniques used in current averaging for memory cell sensing is provided in the commonly assigned, co-pending U.S. patent application Ser. No. 09/938,617, filed Aug. 27, 2001, entitled RESISTIVE MEMORY ELEMENT SENSING USING AVERAGING, which is incorporated herein by reference.

Figure 9:
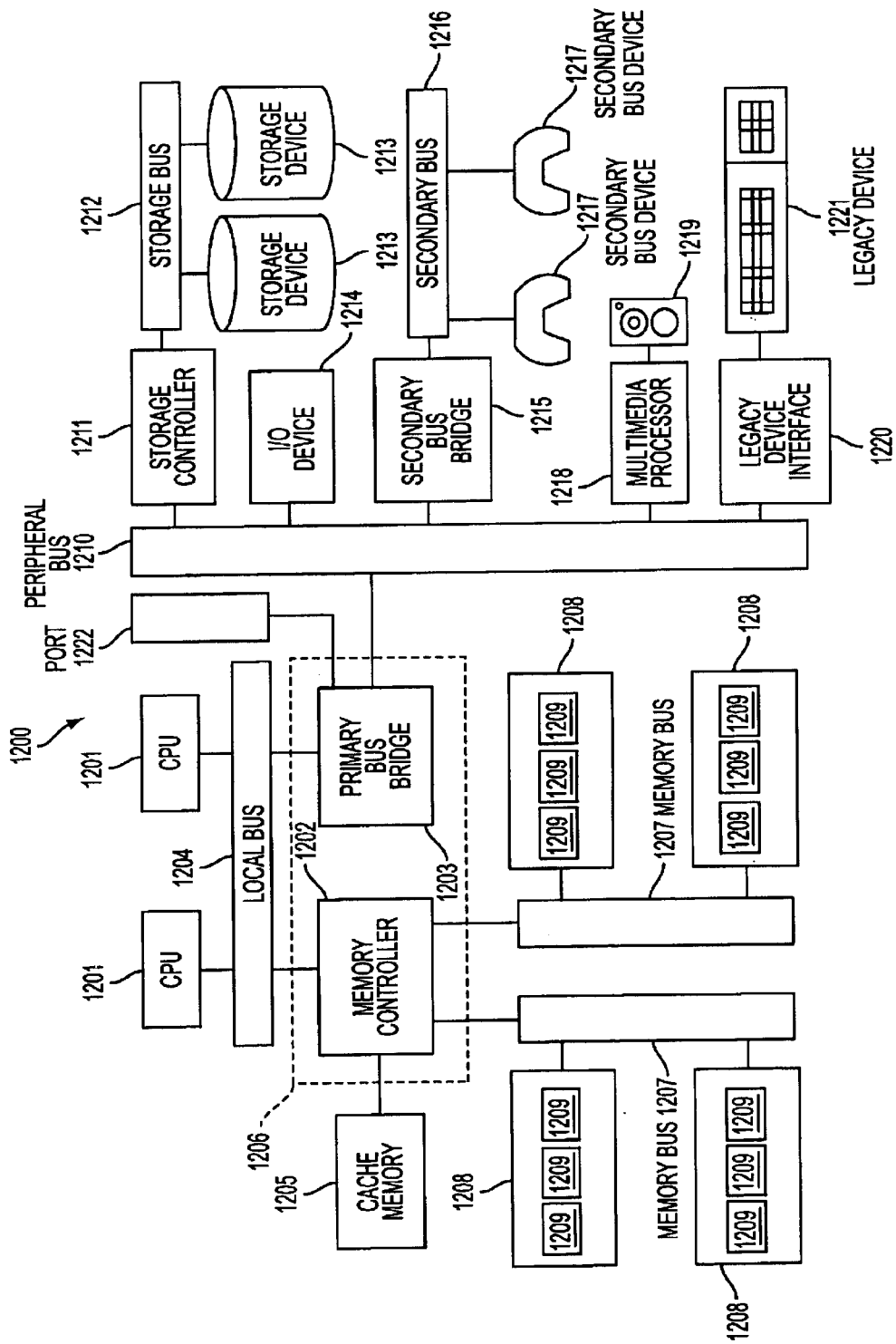
FIG. 9 illustrates an exemplary processing system which utilizes the circuits of FIGS. 3–8.

The operation of the sensing circuit 900 is now described generally with respect to FIG. 8. The resistance $R_{CELL}$ of the resistive memory cell 901 is measured as an input voltage relative to ground. In reading a memory cell, a selected row line, or word line (WL) 910 is activated and a voltage $V_A$ is applied to the resistive divider 901, 902. All other wordlines in the memory array are grounded. As illustrated in FIG. 9, the voltage level of the selected WL 910 is dropped over the cell resistance 901 and a "sneak" resistance 903 that represents the resistance of the other resistive memory cells of the bit line.

Node 902 is connected to a first switch 909, which is coupled to the positive terminal of differential amplifier 905, and is further coupled to capacitor 921. Switch 908 is coupled to the negative terminal of differential amplifier 905, and further to capacitor 922 as shown in FIG. 8. Switches 909 and 908 close and open during the sample time period $T_2$ following the initiation of a read/sense operation at T1 (as described above with respect to FIGS. 5 and 6), to transfer the charge from node 902 to capacitor 921. The voltage on capacitor 921 is sensed at the positive terminal of amplifier 905. Switch 908, which is coupled to ground, operates at the same time as switch 909 to offset switching noise that may be transmitted to amplifier 905 during a sampling period. The voltage applied to differential amplifier 905 causes the amplifier 905 to supply current to either node 914 or 913, and draw current from the other node. Similar to the first embodiment discussed above, the capacitors 921, 922 may be discrete components, or may be the parasitic capacitance of the differential amplifier or input lines connected thereto. Furthermore, the sampling capacitors 921, 922 are also brought to a known voltage prior to a sensing operation to eliminate the residual charge that may exist in the capacitors.

As a result, the capacitor (911 or 912) coupled to the node to which the differential amplifier 905 is supplying a current will be charged, increasing the voltage of the node. Conversely, the capacitor coupled to the node from which the differential amplifier 905 is drawing current will be discharged, decreasing the voltage of that node. A clocked comparator 917 senses the relative voltages of the nodes 914, 913 in response to a clock signal COMP_CLK and generates a corresponding output signal UP. The clocked comparator 917 also generates a complementary output signal DOWN. As illustrated in FIG. 8, an inverter 919 is coupled to the output of the clocked comparator 917 to generate the DOWN signal. However, it will be appreciated that the clocked comparator 917 is provided by way of example, and a clocked comparator suitable for use with the present invention can be implemented in many different ways other than that shown in FIG. 8.

The UP and DOWN signals are provided to the switching current source 920 having a first current source 916 and a second current source 915. Each of the current sources 916, 915 switch between being coupled to the nodes 914, 913 based on the state of the UP and DOWN signals. In one state, the current source 916 is coupled to the node 914, providing current to positively charge the capacitor 912, and the current source 915 is coupled to the node 913, providing current to negatively charge the capacitor 911. In the other state, the current source 916 is coupled to the node 913, providing current to positively charge the capacitor 911, and the current source 915 is coupled to the node 914, providing current to negatively charge the capacitor 912. Consequently, when the UP and DOWN signals switch states, the coupling of the current sources 916, 915 will switch as well.

For example, as illustrated in FIG. 8, the UP and DOWN signals are LOW and HIGH, respectively, causing the current source 916 to be coupled to the node 914 and the current source to be coupled to the node 913. Upon the next rising edge of the COMP_CLK signal, the voltages of the nodes 914, 913 are sensed by the clocked comparator 917. The voltages at the nodes 914, 913 are represented by signals INTOUTP and INTOUTM, respectively. Where the coupling of the current sources 916, 915 are such that the current provided to the capacitors 912, 911 over the period of the COMP_CLK signal causes the voltages of the nodes 914, 913 to change from the previous rising edge of the COMP_PLK signal, the output of the clocked comparator 917 changes logic states. This in turn causes the coupling of the current sources 916, 915 to switch nodes as well. It will be appreciated that the coupling of the current sources 916, 915 will continue to switch until the current provided by the differential amplifier 905 to either one of the capacitors 912, 911 causes the voltage of the respective node 914, 913 to be greater than the change in voltage caused by the current source over one period of the COMP_CLK signal. When this occurs, the logic states of the UP and DOWN signals maintain their present logic states, which causes the average of the output signal of the sensing circuit 900 to change.

FIG. 9 illustrates an exemplary processing system 1200 which utilizes a reduced power sensing circuit such as, for example, the circuit described in connection with FIGS. 3–8. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, a miscellaneous I/O device 1214, a secondary bus bridge 1215, a multimedia processor 1218, and a legacy device interface 1220. The primary bus bridge 1203 may also be coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be an local area network interface, such as an Ethernet card. The secondary bus bridge may be used to interface additional devices via another bus to the processing system. For example, the secondary bus bridge may be an universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 9 is only an exemplary processing system with which the invention may be used. While FIG. 9 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in the context of MRAM, it may be used for sensing the resistive state of other resistive-based memory cells and indeed in any voltage sensing system in which power consumption critical. In addition, while specific values of current, voltage capacitance and resistance have been used to described the illustrated embodiments, it should be apparent that different values may be used in their place without deviating from the scope of the described embodiments. Accordingly, the invention is not limited by the foregoing description or drawings, but is only limited by the scope of the appended claims.

What is claimed as new and desired to be protected by Letters Patent of the United States is:

1. A sensing apparatus for resistive memory cells, comprising:
    an array of resistive memory cells, each cell coupled to a row and bit line;
    a switch circuit for selectively coupling at least one of a row and column line associated with a selected memory cell to a predetermined potential to establish a voltage at a node of a resistive divider which includes the resistance of the selected memory cell, wherein said switch circuit opens and closes for a first period of time when a bit line carries a voltage signal associated with said selected memory cell for a second period of time, said second period of time being longer than said first period of time; and
    a sample and hold circuit for sampling said voltage.

2. The apparatus according to claim 1, wherein the switching circuit comprises a programmable switch.

3. The apparatus according to claim 1, wherein said resistive memory cell is a magnetic memory cell.

4. The apparatus according to claim 1, wherein the switching circuit comprises a transistor.

5. The apparatus according to claim 4, wherein the sample and hold circuit samples the voltage at the expiration of the first period of time.

6. The apparatus according to claim 1, wherein said sample and hold circuit further comprises a capacitive element for holding said voltage.

7. The apparatus according to claim 6, said capacitive element comprises a discrete capacitor.

8. The apparatus according to claim 6, wherein said capacitive element comprises a parasitic capacitance of the bit line.

9. The apparatus according to claim 8, wherein said sample and hold circuit further comprises a sense amplifier, having a first and second input, said capacitive element being coupled to said first input, and a reference signal being coupled to said second input.

10. The apparatus according to claim 6, wherein the capacitive element is further coupled to ground.

11. The apparatus according to claim 10, further comprising a comparator having a first input coupled to the capacitive element and a second input coupled to a reference voltage.

12. The apparatus according to claim 10, wherein said sample and hold circuit further comprises a sensing circuit coupled to the capacitive element.

13. The apparatus according to claim 12, wherein said capacitive element is the parasitic capacitance of the sensing circuit.

14. A method for reading a resistive memory, comprising:
    selecting a resistive memory cell;
    sampling a voltage signal produced by said selected memory cell, wherein the sampling occurs over a period of time that is shorter than the duration of said voltage signal; and
    determining a logical state represented by the resistance of said cell using said sampled voltage.

15. The method according to claim 14, wherein the act of sampling comprises transferring a voltage signal from a bit line coupled to said selected memory cell to a capacitive element.

16. The method according to claim 14, wherein the act of determining a logical state comprises comparing the sampled voltage to a reference voltage.

17. A method for reducing power consumption when sensing a resistive memory element, comprising:
    receiving a voltage signal transmitted on a bit line, coupled to said memory element, wherein said voltage signal is present over a first time period;
    sampling the voltage signal over a second time period, which is less than said first time period; and
    sensing said sampled voltage to determine a resistance of said memory element.

18. The method according to claim 17, wherein the act of sampling over the second time period comprises closing and opening a connection from the bit line to a sensing circuit.

19. The method according to claim 18, wherein the act of sampling further comprises storing the voltage signal on a capacitive element.

20. A memory element sensing apparatus, comprising:
switching means, coupled to a bit line, said bit line being connected to a selected resistive memory element;
capacitive means, coupled to said switching means, wherein said switching means closes and opens for a first period of time, when said bit line carries a voltage signal associated with said memory element for a second period of time, said second period of time being longer than said first period of time, and wherein said voltage signal is stored in the capacitive means; and
sensing means, coupled to said capacitive means for sensing the voltage signal stored by said capacitive means and determining a logical state of said memory element.

21. The apparatus according to claim 20, wherein said capacitive means is a parasitic capacitance.

22. The apparatus according to claim 20, wherein said sensing means is a sense amplifier.

23. The apparatus according to claim 22, wherein said capacitive means discharges the stored voltage signal associated with said memory element into a first input of said sense amplifier.

24. The apparatus according to claim 23, wherein a second input of the sense amplifier receives a reference voltage input.

25. An apparatus for reducing power in a sensing device, coupled to a memory device, comprising:
a first switch, coupled between a first voltage node and a first input of a sensing circuit;
a second switch, coupled between a second voltage node and a second input of the sensing circuit;
a first capacitive element, coupled to the first switch; and
a second capacitive element, coupled to the second switch, wherein said first and second switches close and open during a sensing operation to store a sampled voltage and a reference voltage in the first and second capacitive elements respectively, and wherein the sensing circuit senses the sampled voltage and reference voltage during said sensing operation, and wherein said first switch closes and opens for a first period of time when said one bit line carries a voltage signal associated with a selected resistive memory cell for a second period of time, said second period of time being longer than said first period of time.

26. The apparatus of claim 25, wherein the first capacitive element or second capacitive element is a parasitic capacitance.

27. The apparatus of claim 25, wherein the first capacitive element or second capacitive element is a discrete capacitor.

28. The apparatus of claim 25, wherein the sensing circuit is a differential amplifier.

29. An apparatus, comprising:
a plurality of row and bit lines arranged in an array, said row and bit lines being interconnected by resistive memory cells at the cross point of each row and bit line;
a plurality of switches, each of said plurality of switches having one end connected to a respective bit line, and a second end connected to a sensing device;
a plurality of storage devices, each of said plurality of storage devices being connected to a respective node located at the second end of each switch; and
a voltage source, wherein said voltage source applies a voltage along at least one bit line, and across at least one word line, wherein the switch connected to the at least one bit line closes and opens for a first period of time when said one bit line carries a voltage signal associated with a selected resistive memory cell for a second period of time, said second period of time being longer than said first period of time to sample and store the voltage on a respective storage device, wherein the sampled voltage is sensed by the sensing device.

30. The apparatus according to claim 29, wherein the storage devices are discrete capacitors.

31. The apparatus according to claim 29, wherein the storage devices are the parasitic capacitance of the sensing device.

32. The apparatus according to claim 29, wherein the storage devices are the parasitic capacitance of the bit line.

33. The apparatus according to claim 29, wherein the sensing device is a sense amplifier having a first and second input, said first input being coupled to the second end of the switch, and said second end being coupled to a reference voltage source.

34. A method, comprising:
applying a known voltage to at least one of a plurality of bit lines;
applying a known voltage to at least one of a plurality of row lines, said row and bit lines being interconnected by resistive memory cells at the cross point of each row and bit line;
sampling the voltage on the bit line, wherein the sampling occurs over a period of time that is shorter than the duration of a voltage signal; and
sensing the sampled voltage.

35. A processing system, comprising:
a processing unit;
a sensing apparatus for resistive memory cells coupled to said processing unit, said sensing apparatus comprising:
an array of resistive memory cells, each cell coupled to a row and bit line;
a switch circuit for selectively coupling at least one of a row and column line associated with a selected memory cell to a predetermined potential to establish a voltage at a node of a resistive divider which includes the resistance of the selected memory cell; and
a sample and hold circuit for sampling said voltage, wherein the sampling occurs over a period of time that is shorter than the duration of said voltage.

36. The processing system according to claim 35, wherein said switch circuit opens and closes for a first period of time when a bit line carries a voltage signal associated with said selected memory cell for a second period of time, said second period of time being longer than said first period of time.

37. The processing system according to claim 36, wherein the switching circuit comprises a programmable switch.

38. The processing system according to claim 36, wherein the switching circuit comprises a transistor.

39. The processing system according to claim 38, wherein the sample and hold circuit samples the voltage at the expiration of the first period of time.

40. The processing system according to claim 35, wherein said resistive memory cell is a magnetic memory cell.

41. The processing system according to claim 35, wherein said sample and hold circuit further comprises a capacitive element for holding said voltage.

42. The processing system according to claim 41, wherein said capacitive element comprises a discrete capacitor.

43. The processing system according to claim 41, wherein said capacitive element comprises a parasitic capacitance of the bit line.

44. The processing system according to claim 41, wherein the capacitive element is further coupled to ground.

45. The processing system according to claim 44, wherein said sample and hold circuit further comprises a sensing circuit coupled to the capacitive element.

46. The processing system according to claim 45, wherein said capacitive element is the parasitic capacitance of the sensing circuit.

47. The processing system according to claim 45, wherein said sensing circuit is a sense amplifier, having a first and second input, said capacitive element being coupled to said first input, and a reference signal being coupled to said second input.

48. The processing system according to claim 45, wherein the sensing circuit includes a comparator for comparing a signal at a first input with a signal at a second input.

* * * * *

UNITED STATES PATENT AND TRADEMARK OFFICE
CERTIFICATE OF CORRECTION

PATENT NO. : 6,954,392 B2  
DATED : October 11, 2005  
INVENTOR(S) : R. J. Baker It is certified that error appears in the above-identified patent and that said Letters Patent is hereby corrected as shown below:

<u>Column 6,</u>
Line 37, "coupled the" should read -- coupled to the --;
Line 55, "1200 include" should read -- 1200 includes --;

<u>Column 7,</u>
Line 14, "an local area" should read -- a local area --;
Line 18, "an universal" should read -- a universal --;
Line 19, "1217 via to the" should read -- 1217 to the --;
Line 52, "consumption critical" should read -- consumption is critical --;

<u>Column 8,</u>
Line 22, "claim 6, said" should read -- claim 6, wherein said --.

Signed and Sealed this

Twenty-eighth Day of March, 2006

JON W. DUDAS
*Director of the United States Patent and Trademark Office*